US008912061B2

(12) United States Patent
Frank

(10) Patent No.: US 8,912,061 B2
(45) Date of Patent: Dec. 16, 2014

(54) FLOATING GATE DEVICE WITH OXYGEN SCAVENGING ELEMENT

(75) Inventor: Martin M. Frank, Dobbs Ferry, NY (US)

(73) Assignee: International Business Machines Corporation, Armonk, NY (US)

(*) Notice: Subject to any disclaimer, the term of this patent is extended or adjusted under 35 U.S.C. 154(b) by 244 days.

(21) Appl. No.: 13/534,527

(22) Filed: Jun. 27, 2012

(65) Prior Publication Data

US 2013/0005132 A1 Jan. 3, 2013

Related U.S. Application Data

(63) Continuation-in-part of application No. 13/171,044, filed on Jun. 28, 2011, now Pat. No. 8,541,867.

(51) Int. Cl.
*H01L 21/336* (2006.01)
*H01L 21/28* (2006.01)
*H01L 27/115* (2006.01)

(52) U.S. Cl.
CPC .... *H01L 21/28273* (2013.01); *H01L 27/11521* (2013.01)
USPC ........................................ 438/264

(58) Field of Classification Search
CPC ............ H01L 29/435; H01L 29/42324; H01L 29/788
USPC .......................................... 438/264; 257/315
See application file for complete search history.

(56) References Cited

U.S. PATENT DOCUMENTS

| 6,268,258 | B1 | 7/2001 | Joo et al. |
| 6,444,592 | B1 | 9/2002 | Ballantine et al. |
| 6,528,374 | B2 | 3/2003 | Bojarczuk, Jr. et al. |
| 6,890,807 | B2 | 5/2005 | Chau et al. |
| 7,226,831 | B1 | 6/2007 | Metz et al. |
| 7,750,418 | B2 | 7/2010 | Chudzik et al. |
| 7,989,902 | B2 | 8/2011 | Ando et al. |
| 8,367,496 | B2 | 2/2013 | Ando et al. |
| 2007/0059910 | A1 | 3/2007 | Pei et al. |
| 2007/0215929 | A1* | 9/2007 | Yasuda ......................... 257/314 |
| 2009/0152651 | A1 | 6/2009 | Bu et al. |
| 2009/0269939 | A1 | 10/2009 | Sprey |

(Continued)

OTHER PUBLICATIONS

T. Ando et al., "Ultimate EOT Scaling ( < 5A) Using Hf-Based High-k Gate Dielectrics and Impact on Carrier Mobility," ECS Trans., vol. 28, No. 1. 2010, pp. 115-123.

(Continued)

*Primary Examiner* — Kevin Parendo
(74) *Attorney, Agent, or Firm* — Cantor Colburn LLP; Vazken Alexanian

(57) ABSTRACT

A floating gate device is provided. A tunnel oxide layer is formed over the channel. A floating gate is formed over the tunnel oxide layer. A high-k dielectric layer is formed over the floating gate. A control gate is formed over the high-k dielectric layer. At least one of the control gate and/or the floating gate includes an oxygen scavenging element. The oxygen scavenging element is configured to decrease an oxygen density at least one of at a first interface between the control gate and the high-k dielectric layer, at a second interface between the high-k dielectric layer and the floating gate, at a third interface between the floating gate and the tunnel oxide layer, and at a fourth interface between the tunnel oxide layer and the channel responsive to annealing.

18 Claims, 11 Drawing Sheets

(56) References Cited

U.S. PATENT DOCUMENTS

| | | | |
|---|---|---|---|
| 2009/0294832 | A1* | 12/2009 | Kakoschke et al. ............ 257/324 |
| 2009/0316331 | A1 | 12/2009 | Nakabayashi |
| 2010/0133501 | A1 | 6/2010 | Sakamoto et al. |
| 2010/0213555 | A1 | 8/2010 | Hargrove et al. |
| 2010/0244206 | A1 | 9/2010 | Bu et al. |
| 2010/0320547 | A1 | 12/2010 | Ando et al. |
| 2011/0012210 | A1 | 1/2011 | Xu |
| 2011/0073964 | A1 | 3/2011 | Chowdhury et al. |
| 2011/0207280 | A1 | 8/2011 | Ando et al. |
| 2011/0298053 | A1 | 12/2011 | Zhong et al. |
| 2013/0075833 | A1 | 3/2013 | Liu et al. |

OTHER PUBLICATIONS

T. Ando et al., "Understanding Mobility Mechanisms in Extremely Scaled HfO2 (EOT 0.42 nm) Using Remote Interfacial Layer Scavenging Technique and Vt-tuning Dipoles with Gate-first Process," 2009 IEEE International Electron Devices Meeting (IEDM), Dec. 7-9, 2009, pp. 423-426.

Ogawa, et al., "0.6nm-EOT High-k Gate Stacks with HfSiOx Interfacial Layer Grown by Solid-Phase Reaction Between HfO2 and Si Substrate", Microelectronic Engineering, vol. 84, Issues 9-10, Sep.-Oct. 2007; pp. 1861-1864.

M.M. Frank, "High-k/metal Gate Innovations Enabling Continued CMOS Scaling," Proceedings of the ESSCIRC, Sep. 12-16, 2011, pp. 50-58.

B. Govoreanu et al., "Performance and Reliability of HfAlOx-based Interpoly Dielectrics for Floating-gate Flash Memory," Solid-State Electronics, vol. 52, Issue 4, Apr. 2008, pp. 557-563.

B. Govoreanu, et al., "The Flash Memory for the Nodes to Come: Material Issues from a Device Perspective," ECS Transactions, 19 (2) 649-668 (2009), 10.1149/1.3122122 The Electrochemical Society.

Jan Van Houdt, "Charge-based Nonvolatile Memory: Near the End of the Roadmap?" Current Applied Physics 11 (2011) e21-e24, Current Applied Physics, journal homepage: www.elsevier.com/locate/cap, Memory Devices Design Group, Imec, Kapeldreef 75, B-3001 Leuven, Belgium.

H.S. Jung et al., "A Highly Manufacturable MIPs (Metal Inserted Poly-Si Stack) Technology with Novel Threshold with Novel Threshold Voltage Control," Digest of Technical Papers, 2005 Symposium on VLSI Technology, Jun. 14-16, 2005, pp. 232-233.

H.Y. Lee et al., "HfOx Bipolar Resistive Memory with Robust Endurance Using AlCu as Buffer Electrode," IEEE Electron Device Letters, vol. 30, No. 7, 2009, pp. 703-705.

C. Ludwig, "Advances in Flash Memory Devices," Materials Science-Poland, vol. 28, No. 1, 2010, pp. 1-11.

U.S. Appl. No. 13/171,044; Titled: Metal Insulator Metal Structure with Remote Oxygen Scavenging, Inventor: M. Frank; filed Jun. 28, 2011.

W. Weinreich, et al., "Impact of Interface Variations on J-V and C-V Polarity Asymmetry of MIM Capacitors with Amorphous and Crystalline Zr(1-x)AlxO2 Films," Microelectronic Engineering 86 (2009) 1826-1829, journal homepage: www.elsevier.com/locate/mee, Microelectronic Engineering.

Wenger et al., "The Role of the HfO2-TiN Interface in Capacitance-Voltage Nonlinearity of Metal-Insulator-Metal Capacitors," Thin Solid Films 517 (2009) 6334-6336, journal homepage: www.elsevier.com/locate/tsf.

M.C. Wu et al., "Highly Stable SrZrO3 Bipoloar Resistive Switching Memory by Ti Modulation Layer," ECS Trans., vol. 28, No. 2, 2010, pp. 411-420.

\* cited by examiner

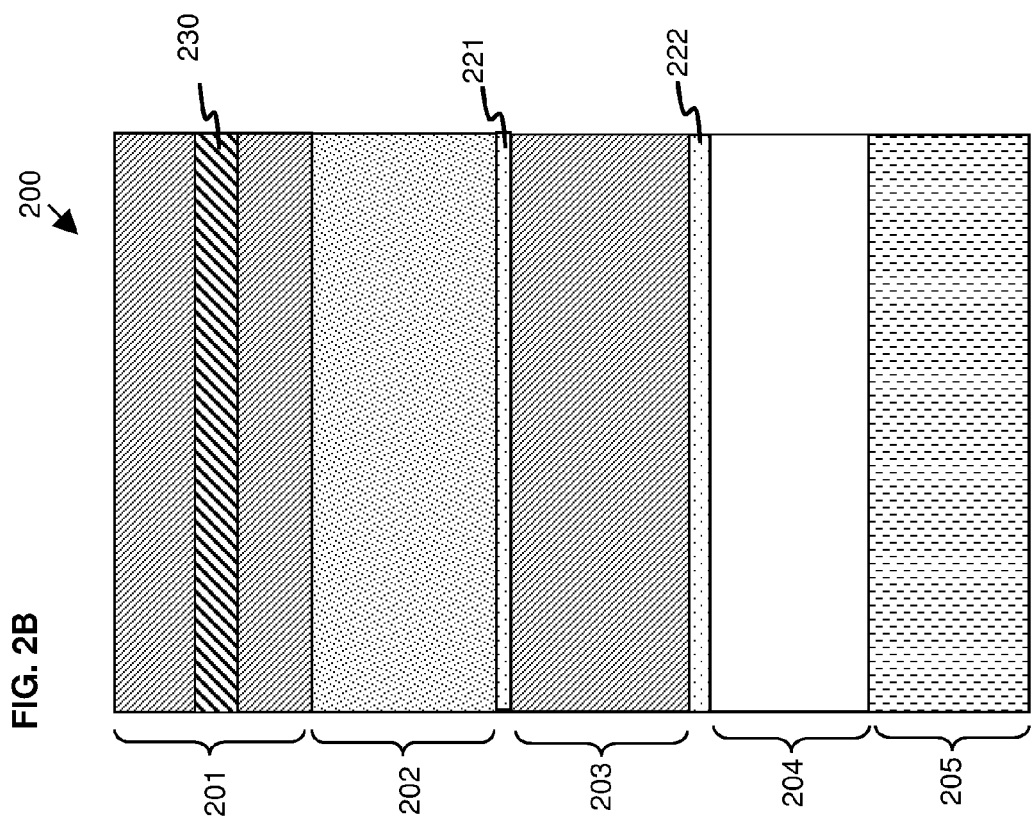

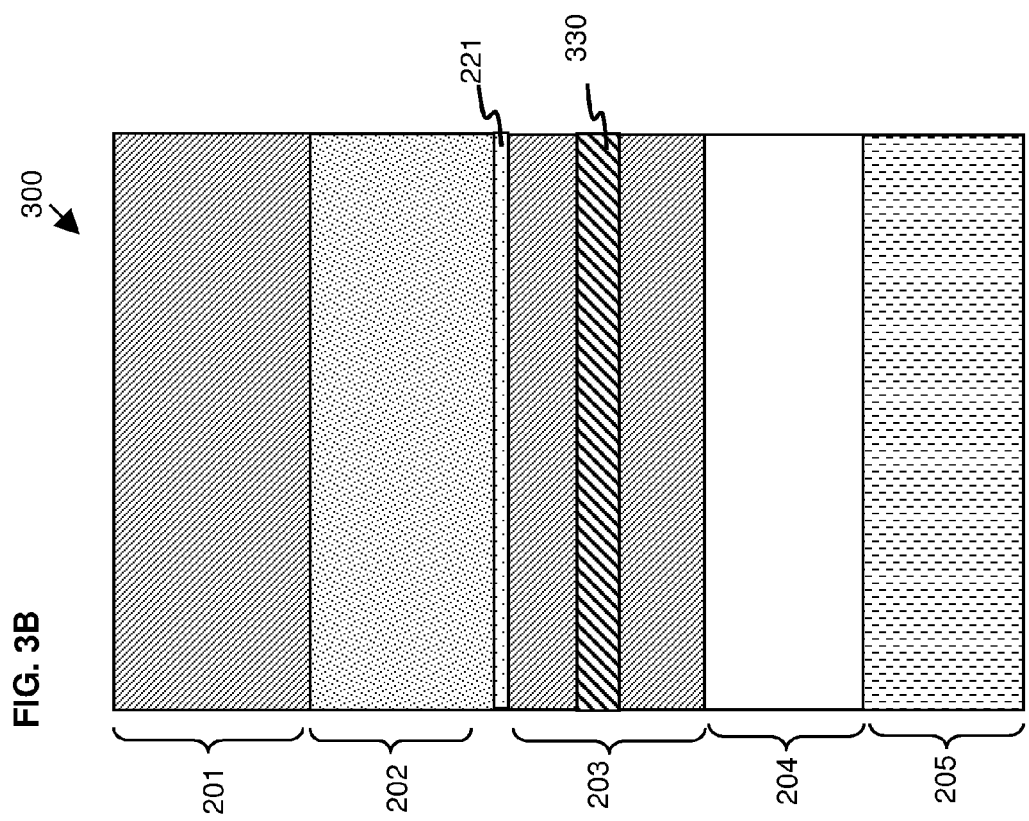

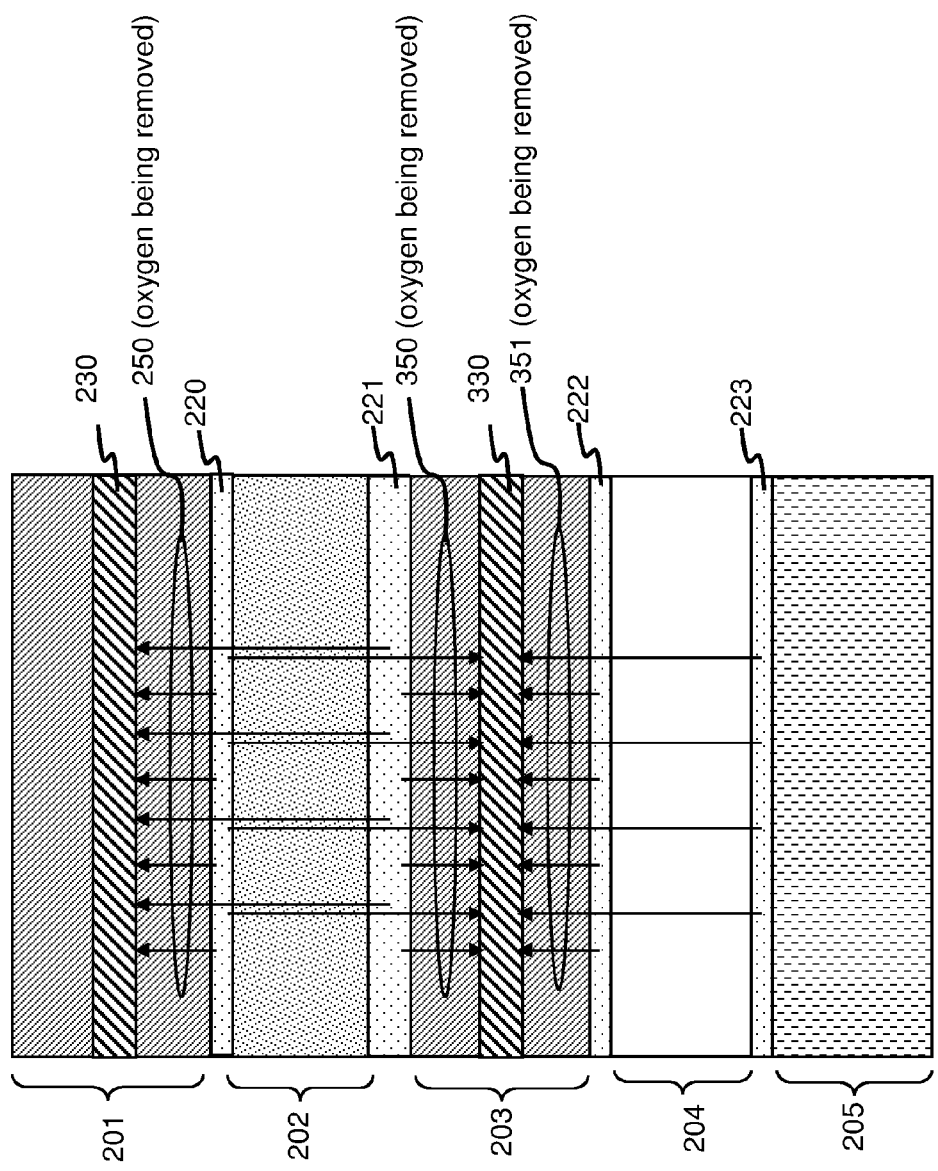

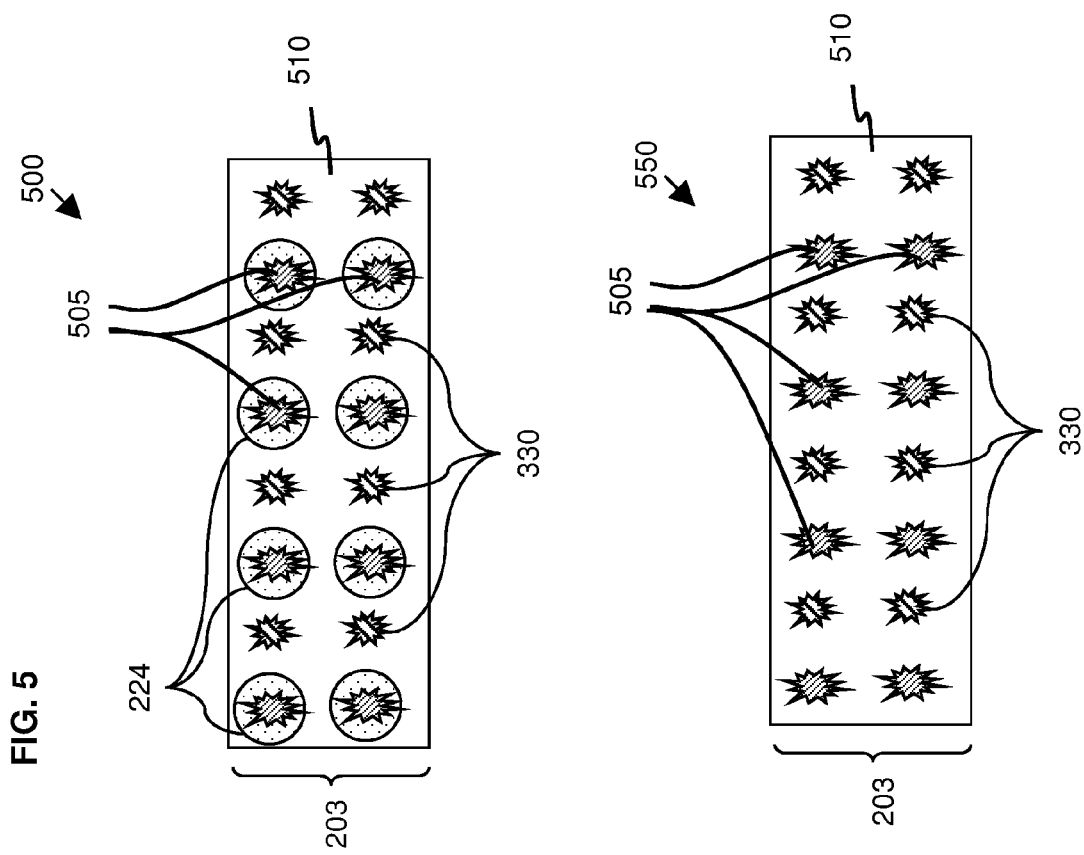

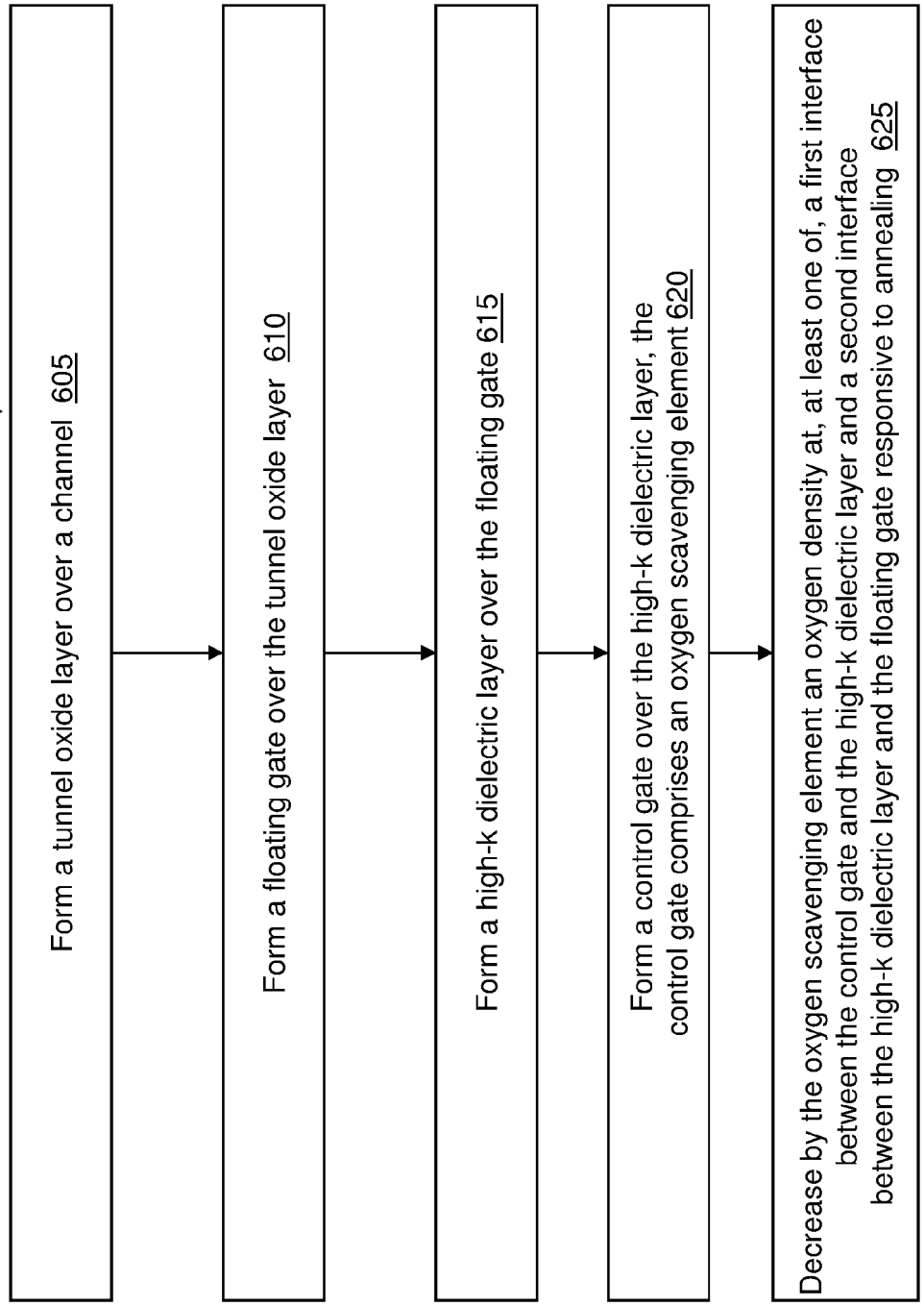

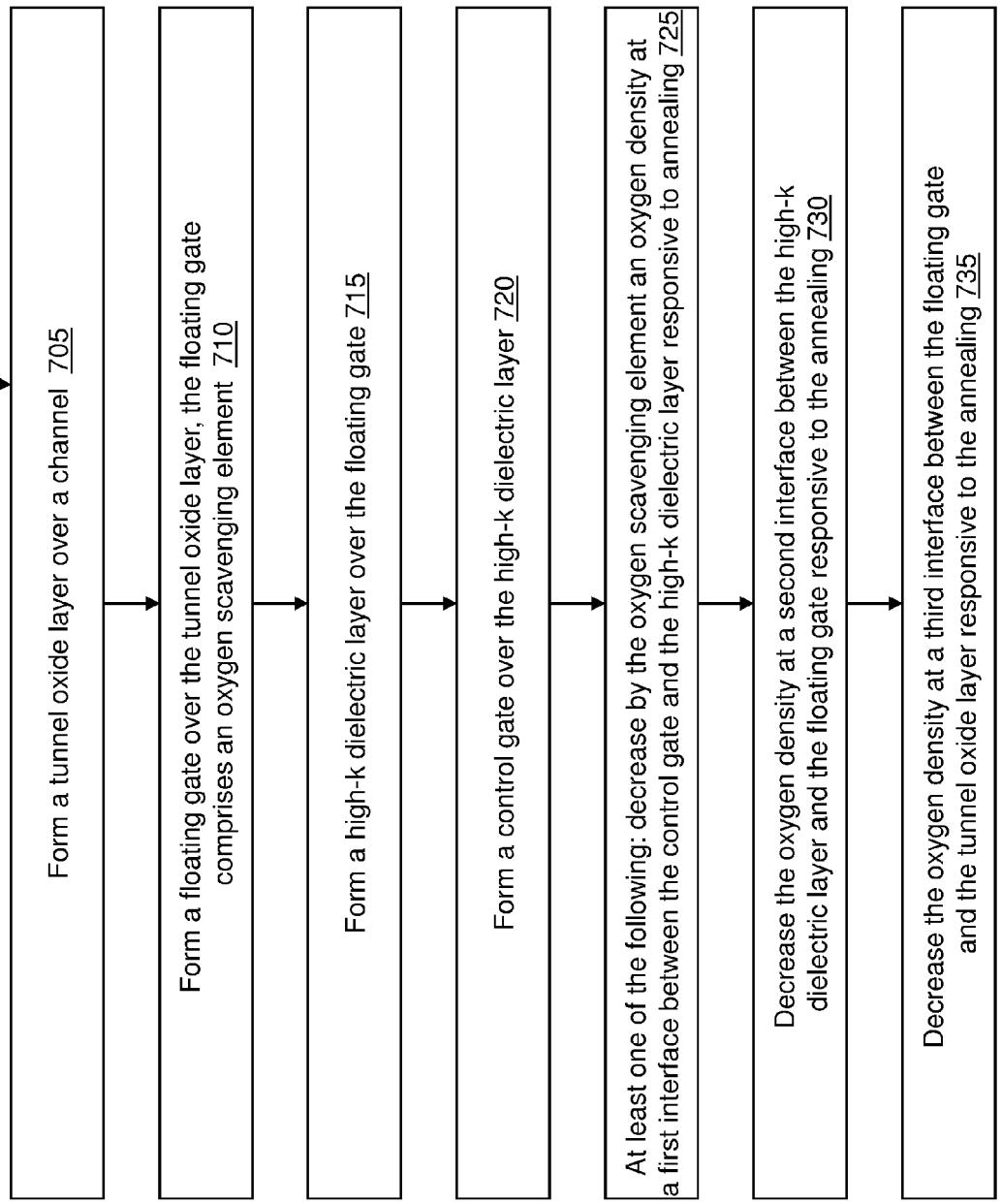

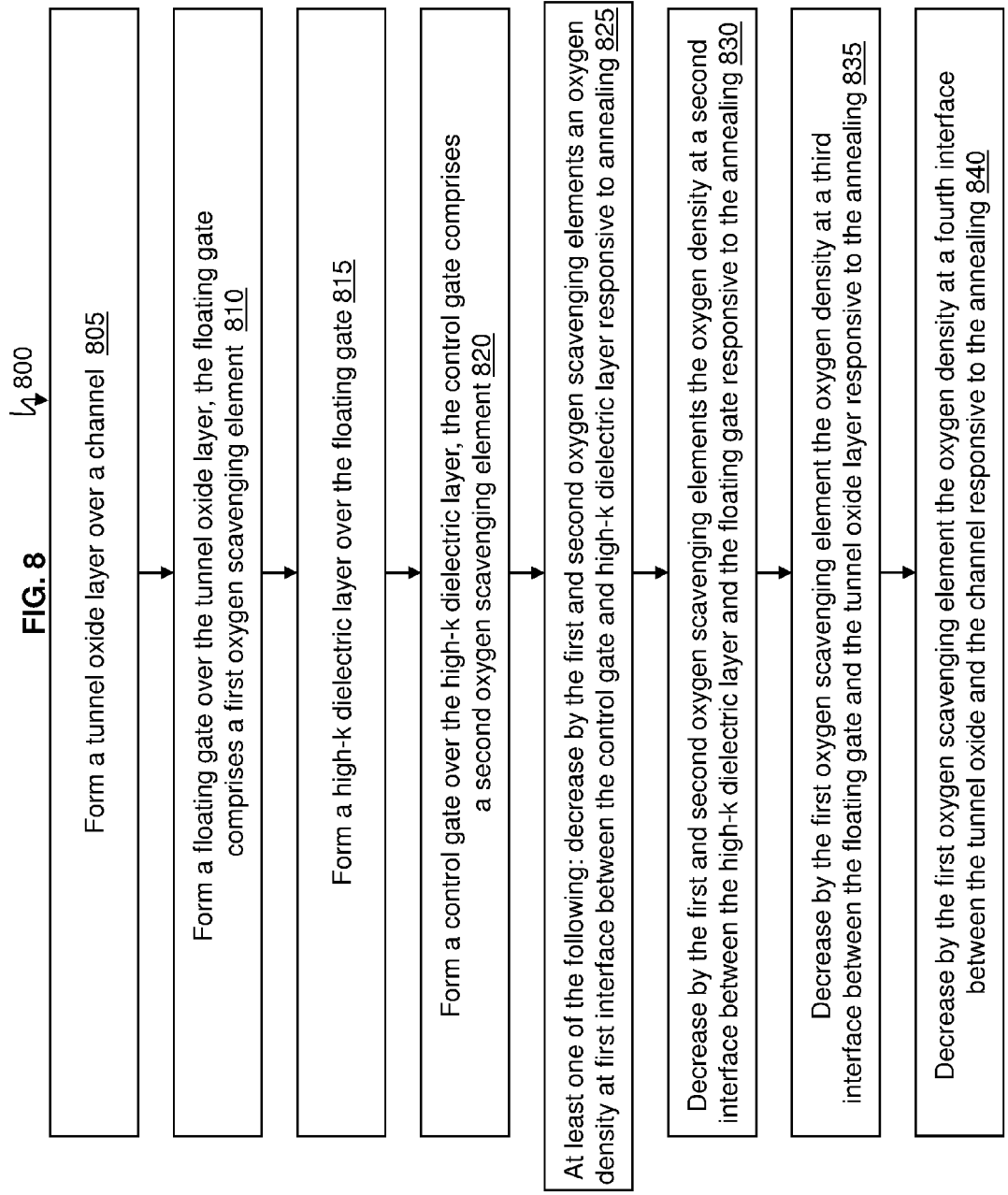

FLOATING GATE DEVICE WITH OXYGEN SCAVENGING ELEMENT

This is a continuation-in-part application of U.S. non-provisional application Ser. No. 13/171,044 filed Jun. 28, 2011, the contents of which are incorporated by reference herein.

BACKGROUND

The present invention generally relates to floating gate devices, and more specifically, to oxygen scavenging elements in floating gate devices.

Floating gate devices can be used for long-term nonvolatile information storage. A common type of floating gate is a polysilicon or metal layer surrounded by insulating oxides. Other types of floating gate include an insulator layer with embedded silicon or metal particles ('nanocrystals'). Charge on the floating gate is stored permanently, providing a long-term memory. Because a large number of electrons can be stored on an integrated circuit capacitor, one can store a nearly continuous analog voltage. Furthermore, the charge on this floating gate can be modified by applying large voltages across a dielectric layer to tunnel electrons though the dielectric, or by adding electrons using hot-electron injection.

BRIEF SUMMARY

According to an embodiment, a floating gate device is provided. The floating gate device includes a tunnel oxide layer formed over a channel, a floating gate formed over the tunnel oxide layer, a high-k dielectric layer formed over the floating gate, and a control gate formed over the high-k dielectric layer. The control gate includes an oxygen scavenging element. The oxygen scavenging element is configured to decrease an oxygen density at a first interface between the control gate and the high-k dielectric layer and at a second interface between the high-k dielectric layer and the floating gate responsive to annealing.

According to an embodiment, a floating gate device is provided. The floating gate device includes a tunnel oxide layer formed over a channel, a floating gate formed over the tunnel oxide layer. The floating gate includes an oxygen scavenging element. The floating gate device includes a high-k dielectric layer formed over the floating gate and a control gate formed over the high-k dielectric layer. The oxygen scavenging element is configured to decrease an oxygen density at a first interface between the control gate and the high-k dielectric layer, decrease the oxygen density at a second interface between the high-k dielectric layer and the floating gate, and decrease the oxygen density at a third interface between the floating gate and the tunnel oxide layer responsive to annealing.

According to an embodiment, a floating gate device is provided. The floating gate device includes a tunnel oxide layer formed over a channel, and a floating gate formed over the tunnel oxide layer. The floating gate includes a first oxygen scavenging element, a high-k dielectric layer formed over the floating gate, and a control gate formed over the high-k dielectric layer. The control gate includes a second oxygen scavenging element. The first and second oxygen scavenging elements are configured to decrease an oxygen density at a first interface between the control gate and the high-k dielectric layer and decrease the oxygen density at a second interface between the high-k dielectric layer and the floating gate. The first oxygen scavenging element is configured to decrease the oxygen density at a third interface between the floating gate and the tunnel oxide layer and decrease the oxygen density at a fourth interface between the tunnel oxide and the channel responsive to the annealing.

According to an embodiment, a method for forming a floating gate device is provided. The method includes forming a tunnel oxide layer over a channel, forming a floating gate over the tunnel oxide layer, forming a high-k dielectric layer over the floating gate, and forming a control gate over the high-k dielectric layer. The control gate includes an oxygen scavenging element. The method includes decreasing by the oxygen scavenging element an oxygen density at a first interface between the control gate and the high-k dielectric layer and at a second interface between the high-k dielectric layer and the floating gate responsive to annealing.

According to an embodiment, a method for forming a floating gate device is provided. The method includes forming a tunnel oxide layer over a channel, and forming a floating gate over the tunnel oxide layer. The floating gate includes an oxygen scavenging element. The method includes forming a high-k dielectric layer over the floating gate, forming a control gate over the high-k dielectric layer, decreasing by the oxygen scavenging element an oxygen density at a first interface between the control gate and the high-k dielectric layer responsive to annealing, decreasing the oxygen density at a second interface between the high-k dielectric layer and the floating gate responsive to the annealing, and decreasing the oxygen density at a third interface between the floating gate and the tunnel oxide layer responsive to the annealing.

According to an embodiment, a method for forming a floating gate device is provided. The method includes forming a tunnel oxide layer over a channel, and forming a floating gate over the tunnel oxide layer. The floating gate includes a first oxygen scavenging element, forming a high-k dielectric layer over the floating gate, and forming a control gate over the high-k dielectric layer. The control gate includes a second oxygen scavenging element. The method includes decreasing by the first and second oxygen scavenging elements an oxygen density at a first interface between the control gate and the high-k dielectric layer responsive to annealing, and decreasing by the first and second oxygen scavenging elements the oxygen density at a second interface between the high-k dielectric layer and the floating gate responsive to the annealing. The method includes decreasing by the first oxygen scavenging element the oxygen density at a third interface between the floating gate and the tunnel oxide layer responsive to the annealing, and decreasing by the first oxygen scavenging element the oxygen density at a fourth interface between the tunnel oxide and the channel responsive to the annealing.

Additional features are realized through the techniques of the present disclosure. Other systems, methods, and/or apparatus according to other embodiments are described in detail herein and are considered a part of the claimed invention. For a better understanding of exemplary embodiments and features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other features of the present disclosure are apparent from the following detailed description taken in conjunction with the accompanying drawings in which:

FIG. 2B is a cross-sectional view of the floating gate device with an oxygen scavenging element in a control gate once oxygen is removed according to an embodiment.

FIG. 3B is a cross-sectional view of the floating gate device with the oxygen scavenging element in the floating gate once oxygen is removed according to an embodiment.

FIG. 4A is a cross-sectional view of a floating gate device with an oxygen scavenging element in both a floating gate and control gate before oxygen is removed according to an embodiment.

FIG. 5 is a cross-sectional view of the floating gate with nanocrystals of silicon to hold a charge according to an embodiment.

FIG. 6 is a method for fabricating a floating gate device with a scavenging element in a control gate according to an embodiment.

FIG. 7 is a method for fabricating a floating gate device with a scavenging element in a floating gate according to an embodiment.

FIG. 8 is a method for fabricating a floating gate device with a scavenging element in both a floating gate and control gate according to an embodiment.

DETAILED DESCRIPTION

Figure 1B:
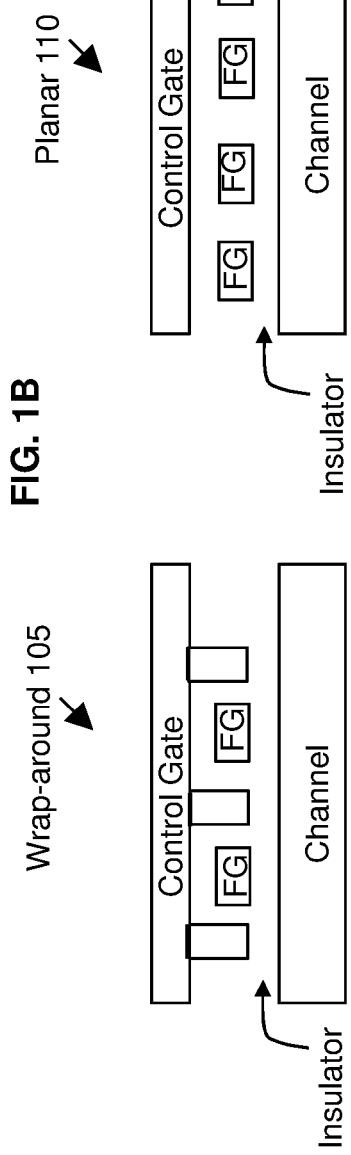
FIG. 1B is a cross-sectional view of a floating gate device with a wrap around control gate and a cross-sectional view of a floating gate device with a planar control gate.
Figure 1A:
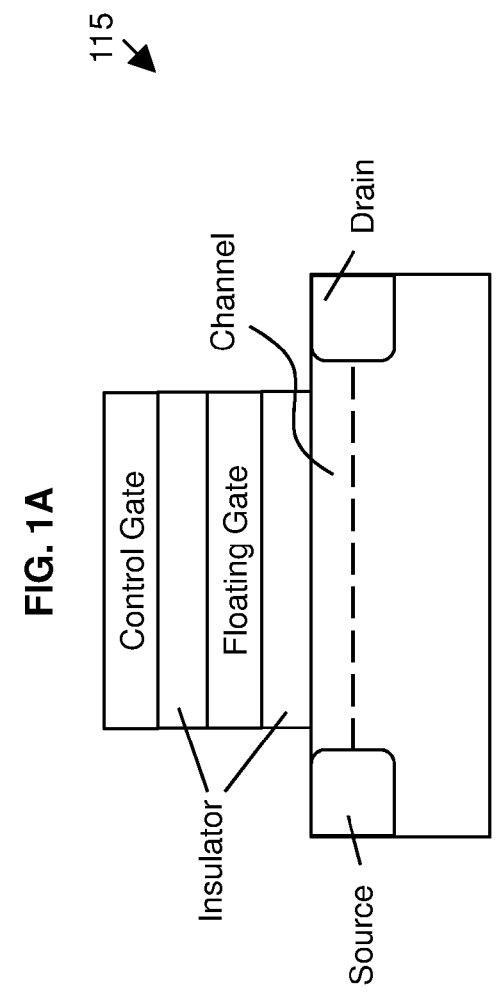
FIG. 1A is a depiction of a floating gate device.

FIG. 1A is a depiction of a floating gate device 115. The floating gate (FG) device 115 is a field-effect transistor (FET), whose structure is similar to a conventional FET. The floating gate of the floating gate device 115 is electrically isolated, creating a floating node, and a number of secondary gates such as the control gate (CG) or inputs can be deposited above the floating gate (FG) and are electrically isolated from it. These inputs are only capacitively connected to the FG. Since the FG is completely surrounded by highly resistive material (i.e., insulators such as oxides), the charge contained in the FG remains unchanged for long periods of time. Usually Fowler-Nordheim tunneling and hot-carrier injection mechanisms are used to modify the amount of charge stored in the FG.

An insulator layer is under the floating gate, and a channel is formed under this insulator layer by applying voltage to the control gate (CG).

FIG. 1B illustrates an example of a cross-sectional view of a floating gate device 105 with a wrap around control gate (CG) and a cross-sectional view of a floating gate device 110 with a planar control gate. Note that for the cross-sectional views of the floating gate devices 105 and 110, the viewer/reader is at the source and the drain is unseen behind the figure. Accordingly, the source and drain are not seen but are operatively included as understood by one skilled in the art.

In the floating gate device 105, the control gate (CG) wraps around the floating gate (along with the insulator surrounding the floating gate) and forms capacitances around the floating gate through the insulator layer. In the floating gate device 110, the control gate (CG) does not wrap around the sides of the floating gate, and thus the control gate is planar. However, the capacitance between the control gate and the floating gate is lower in the planar floating gate device 110, and for many practical applications the insulator film used between the control gate and floating gate particularly is a high-k interpoly dielectric (IPD). The term high-k dielectric refers to a material with a high dielectric constant (permittivity) "k" (as compared to silicon dioxide) used in semiconductor manufacturing processes which replaces the silicon dioxide gate dielectric (that has a lower dielectric constant "k").

High-k interpoly dielectrics (IPD) (such as the insulator film between the control gate and the floating gate), replacing the current silicon ONO (oxide-nitride-oxide) stack, are required to enable future scaling of floating gate (FG) NAND flash memory. High-k IPD improves the coupling of control gate (CG) and FG, making it possible to transition from the traditional wrap around gate with (approximately 8-12 nm) ONO IPD to a flat structure (like planar floating gate device 110) which enables higher integration density.

Native oxide is often formed inadvertently at the high-k IPD and FG interface (and also at CG and channel interfaces), but it is often beneficial to ensure minimum or no such oxide is present, e.g., in order to maximize the size of the memory window. Oxidation can be, e.g., due to air exposure during wafer transfer, exposure to and oxidizing deposition process, and/or oxygen released from the dielectric at later stages of device processing.

In a state of the art technique to minimize oxide, rare earth high-k dielectrics convert native $SiO_2$ into a rare earth silicate, but this excludes the use of certain material as the high-k dielectrics such as, e.g., $Al_2O_3$ (aluminum oxide) and/or HfSiO (hafnium silicate) which do not exhibit the same thermodynamic tendency to form silicates.

Rare-earth high-k dielectrics include scandium oxide ($Sc_2O_3$), yttrium oxide ($Y_2O_3$), and lanthanide oxides such as $La_2O_3$. Other high-k dielectrics include but are not limited to $HfO_2$, HfSiO, HfSiON, HfAlO (hafnium aluminate), $Al_2O_3$, and combinations or multilayers of such materials.

According to an embodiment, an oxygen scavenging element/layer is placed inside one of the electrodes or both electrodes (e.g., the floating and/or control gates) to trap oxygen and thus reduce/remove undesirable native oxides formed at the floating gate and IPD interface, the floating gate and tunnel oxide layer interface, the control gate and IPD interface, and/or the channel and tunnel oxide layer interface.

Figure 2A:
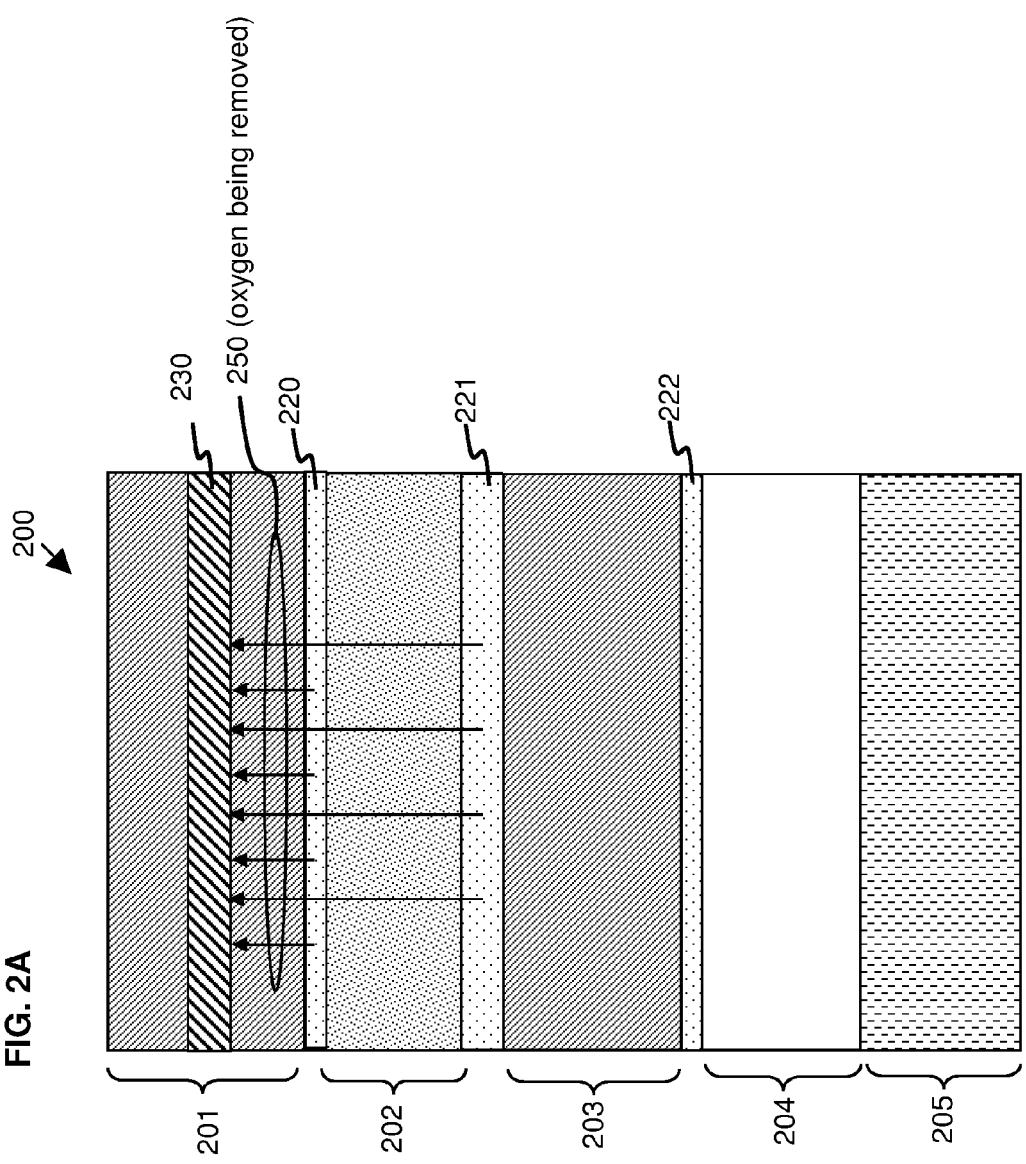
FIG. 2A is a cross-sectional view of a floating gate device with an oxygen scavenging element in a control gate before oxygen is removed according to an embodiment.

FIGS. 2A and 2B (generally referred to as FIG. 2) are a cross-sectional view a floating gate device 200 according to an embodiment. FIG. 2A shows the floating gate device 200 before the oxygen is removed, and FIG. 2B shows the floating gate device 200 after the oxygen is removed (and/or reduced). For simplicity, the floating gate device 200 represents a planar floating gate device (such as, e.g., the planar floating gate device 110) but the oxygen scavenging technique also applies to wrap-around devices (such as the wrap-around floating gate device 105) and other devices.

The floating gate device 200 has a channel 205 which may be formed of silicon. A tunnel oxide 204 is formed on top of the channel 205. The tunnel oxide 204 may be a metal oxide, such as, e.g., $Al_2O_3$ (aluminum oxide). The tunnel oxide 204 may also be SiO(N) (silicon oxynitride).

A floating gate 203 may be formed on top of the tunnel oxide 204. The floating gate 203 may be silicon, a metal such as, e.g., TiN (titanium nitride), or a combination of such materials. A high-k IPD 202 (layer) is formed on the floating gate 203. Materials for the high-k IPD 202 may include $Al_2O_3$ and HfSiO.

A control gate 201 may be formed on the high-k IPD 202. The control gate 201 may be a metal such as, e.g., TiN.

A native oxide layer 220 may grow at the interface between the control gate 201 and high-k IPD 202 and can be created because of oxidation. The native oxide layer 220 may be, e.g., $TiO_2$ (titanium dioxide and titanium (IV) oxide) when the control gate 201 is TiN.

A native oxide layer 221 may be created at the interface between the high-k IPD 202 and the floating gate 203. The native oxide layer 221 may be, e.g., $SiO_2$ (silicon oxide) when the floating gate is silicon or $TiO_2$ when the floating gate 203 is TiN.

Also, a native oxide layer 222 may be created at the interface of the floating gate 203 and the tunnel oxide layer 204 (e.g., SiO(N)). The native oxide layer 222 may be, e.g., $SiO_2$ (silicon oxide) when the floating gate is silicon or $TiO_2$ when the floating gate 203 is TiN.

FIG. 2 shows an example of the control gate 201 with an oxygen scavenging layer (element) 230. The oxygen scavenging element/layer 230 is utilized to remotely remove oxygen (i.e., native oxides) from the interfaces (discussed herein). In one case, the scavenging layer/element 230 may be aluminum (Al).

The control gate 201 is fabricated with the scavenging element 230 (which also applies for scavenging element 330 discussed below) comprising scavenging element S. For the scavenging element 230, the Gibbs free energy change (Equation 1) for the reaction, $x \cdot m\ S + y\ E_nO_m \rightarrow m\ S_xO_y + y \cdot n\ E$, is negative.

S=the scavenging element (e.g., such as Al, which may be the material of the scavenging element 230), E=the electrode element (metal) that is initially oxidized, its oxide having stoichiometry $E_nO_m$, and is being reduced during annealing (heating), and O=oxygen. Also, x denotes #amount of atoms or #amount of moles, m denotes #amount of atoms or #amount of moles, y denotes #amount of atoms or #amount of moles, and n denotes #amount of atoms or #amount of moles. Also, $x \cdot m$ denotes x multiplied by m, and $y \cdot n$ denotes y multiplied by n.

In one case, the control gate 201 is charge trapping flash (e.g. TANOS). For example, in the case of TANOS=TaN—$Al_2O_3$—$Si_3N_4$—$SiO_2$—Si, the control gate could be a scavenging gate that removes $Ta_2O_5$ from the TaN—$Al_2O_3$ interface.

An anneal process is applied to the floating gate device 200. The anneal process is a heat treatment that alters the microstructure of a material. During the anneal process, the floating gate device 200 is heated to elevate its temperature. By annealing the floating gate device 200, this initiates the oxygen scavenging process of the oxygen scavenging element 230 in which the scavenging element 230 removes oxygen atoms from the native oxide layers 220 and 221. The arrows 250 illustrate oxygen being removed from the native oxide layers 220 and 221 and moving toward the scavenging element 230 in the control gate 201 (electrode). Although the arrows 250 show the material of the scavenging element 230 scavenging oxygen impurities from the native oxide layers 220 and 221, the scavenging element 230 can remove oxygen impurities from other areas in the floating gate device 200. During the scavenging process, there is a net flow of oxygen to the scavenging element 230 (formed within the control gate 201), and the oxygen from the native oxide layers 220 and 221 oxidizes the scavenging element 230. Accordingly, the material of the scavenging element 230 may change from Al to $Al_xO_y$ (i.e., aluminum oxide) after the oxygen scavenging process is completed. The scavenging element 230 may be multiple layers formed within the control gate 201. Also, the scavenging element 230 may represent the scavenging material (e.g., Al) dispersed throughout the control gate 201, and the oxygen atoms (i.e., ions) attach to the scavenging material dispersed throughout the control gate 201.

FIG. 2B is the cross-sectional view of the floating gate device 200 after the anneal process according to an embodiment. In FIG. 3, the native oxide layers 220 and 221 are completely and/or partially removed. Also, the scavenging element 230 (formed within the control gate 201) has now been oxidized by the oxygen absorbed from the native oxide layers 220 and 221.

It is noted that the layers of the floating gate device 200 (as well as floating gate devices 300 and 400) may be formed, for example, by chemical vapor deposition (CVD), physical vapor deposition (PVD), atomic layer deposition (ALD), and/or other techniques known in the art.

Figure 3A:
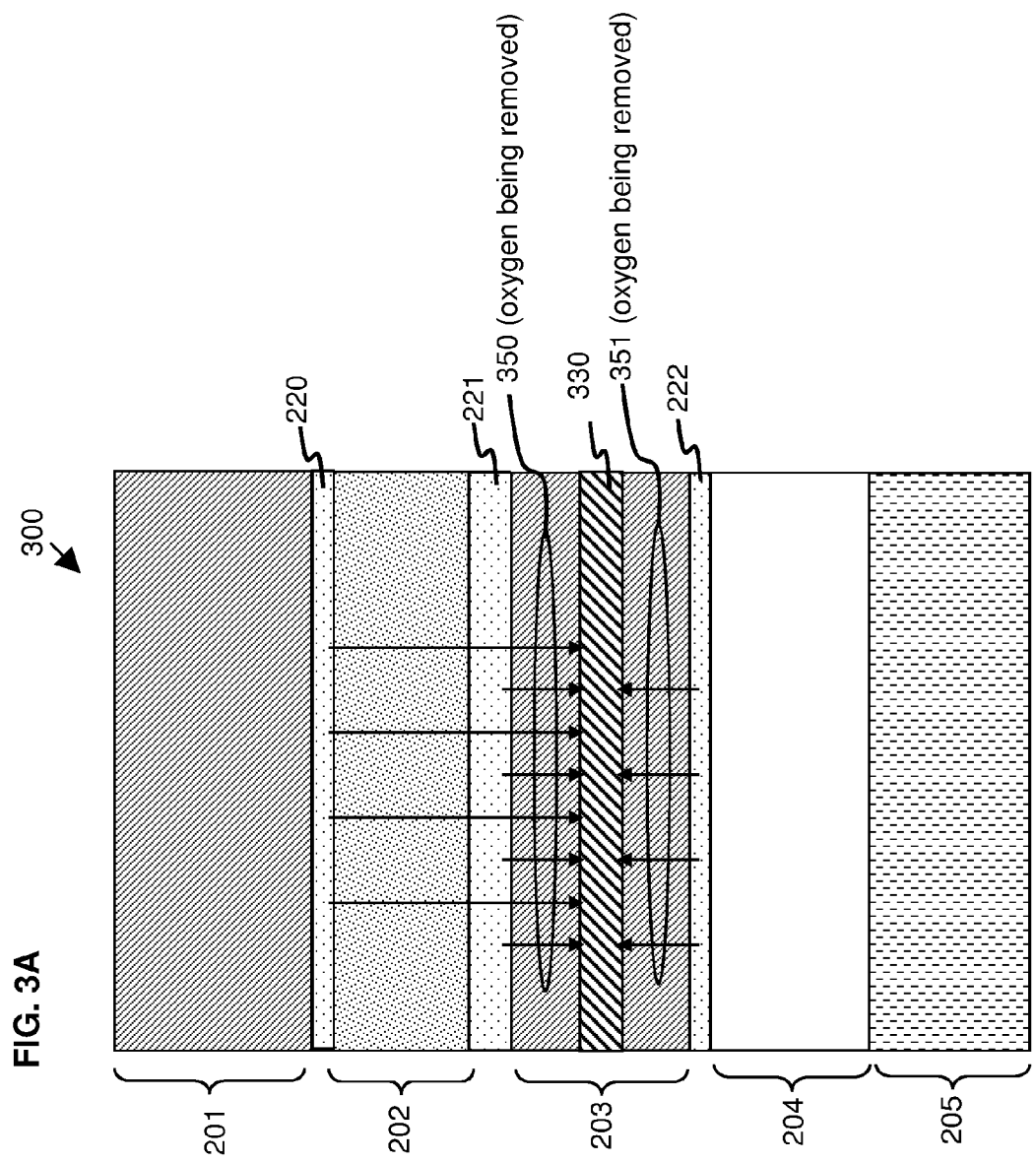
FIG. 3A is a cross-sectional view of a floating gate device with an oxygen scavenging element in a floating gate before oxygen is removed according to an embodiment.

Now turning to FIGS. 3A and 3B (generally referred to as FIG. 3), a cross-sectional view a floating gate device 300 is illustrated according to an embodiment. FIG. 3A shows the floating gate device 300 before the oxygen is removed, and FIG. 3B shows the floating gate device 300 after the oxygen is removed (and/or reduced). For simplicity, the floating gate device 300 represents a planar floating gate device (such as, e.g., the planar floating gate device 110) but the oxygen scavenging technique also applies to wrap-around devices (such as the wrap-around floating gate device 105) and other devices.

The floating gate device 300 has the channel 205 which may be formed of silicon. The tunnel oxide 204 is formed on top of the channel 205. The tunnel oxide 204 may be a metal oxide, such as, e.g., $Al_2O_3$ (aluminum oxide). The tunnel oxide 204 may also be SiO(N).

The floating gate 203 may be formed on top of the tunnel oxide 204. The floating gate 203 may be a metal such as, e.g., TiN (titanium nitride). The high-k IPD 202 (layer) is formed on the floating gate 203. Materials for the high-k IPD 202 may include $Al_2O_3$ and HfSiO. The control gate 201 may be formed on the high-k IPD 202. The control gate 201 may be a metal such as, e.g., TiN.

The native oxide layer 220 may grow at the interface between the control gate 201 and high-k IPD 202 and can be created because of oxidation. The native oxide layer 220 may be $TiO_2$ (titanium dioxide and titanium (IV) oxide) when the control gate 201 is TiN.

The native oxide layer 221 (such as $TiO_2$) may be created at the interface between the high-k IPD 202 and the floating gate 203 (TiN). The native oxide layer 221 may be $TiO_2$ when the floating gate 203 is TiN.

The native oxide layer 222 may be created at the interface of the floating gate 203 and the tunnel oxide (e.g., SiO(N)). The native oxide layer 222 may be $TiO_2$ when the floating gate 203 is TiN.

FIG. 3 shows an example of the floating gate 203 with an oxygen scavenging layer (element) 330 as compared to FIG. 2 showing the control gate 201 with the oxygen scavenging element 230. As discussed for the oxygen scavenging element 230, the oxygen scavenging element 330 is utilized to remotely remove oxygen (i.e., native oxides) from the interfaces (discussed herein). In one case, the oxygen scavenging element 330 may be aluminum (Al). As presented above, Equation 1 and its discussion also apply to the oxygen scavenging element 330.

Annealing is applied to the floating gate device 300 as discussed above for the floating gate device 2300. The floating gate device 300 is heated to elevate its temperature. By annealing the floating gate device 300, this initiates the oxygen scavenging process of the scavenging element 330 in which the scavenging element 330 removes oxygen atoms from the native oxide layers 220, 221, and 222. The arrows 350 and 351 illustrate oxygen being removed from the native oxide layers 220, 221, and 222 and attracted to the floating gate 203 (electrode). Although the arrows 350 and 351 show the material of the scavenging element 330 scavenging oxygen impurities from the native oxide layers 220, 221, and 222, the scavenging element 330 can remove oxygen impurities from other areas in the floating gate device 300. During the scavenging process, there is a net flow of oxygen to the scavenging element 330 (formed within the floating gate 203), and the oxygen from the native oxide layers 220, 221, and 222 oxidizes the scavenging element 330. Accordingly, the material of the scavenging element 330 may change from Al to $Al_xO_y$ (i.e., aluminum oxide) after the oxygen scavenging process is completed. The scavenging element 330 may be multiple layers formed within the floating gate 203. Also, the scavenging element 330 may represent the scavenging material (e.g., Al) dispersed throughout the floating gate 203, and the oxygen atoms (i.e., ions) attach to the scavenging material dispersed throughout the floating gate 203.

FIG. 3B is the cross-sectional view of the floating gate device 300 after the anneal process according to an embodiment. In FIG. 3, the native oxide layer 220, 221, and 222 are completely and/or partially removed. Also, the scavenging element 330 (formed within the floating gate 203) has now been oxidized by the oxygen absorbed from the native oxide layers 220, 221, and 222.

Figure 4B:
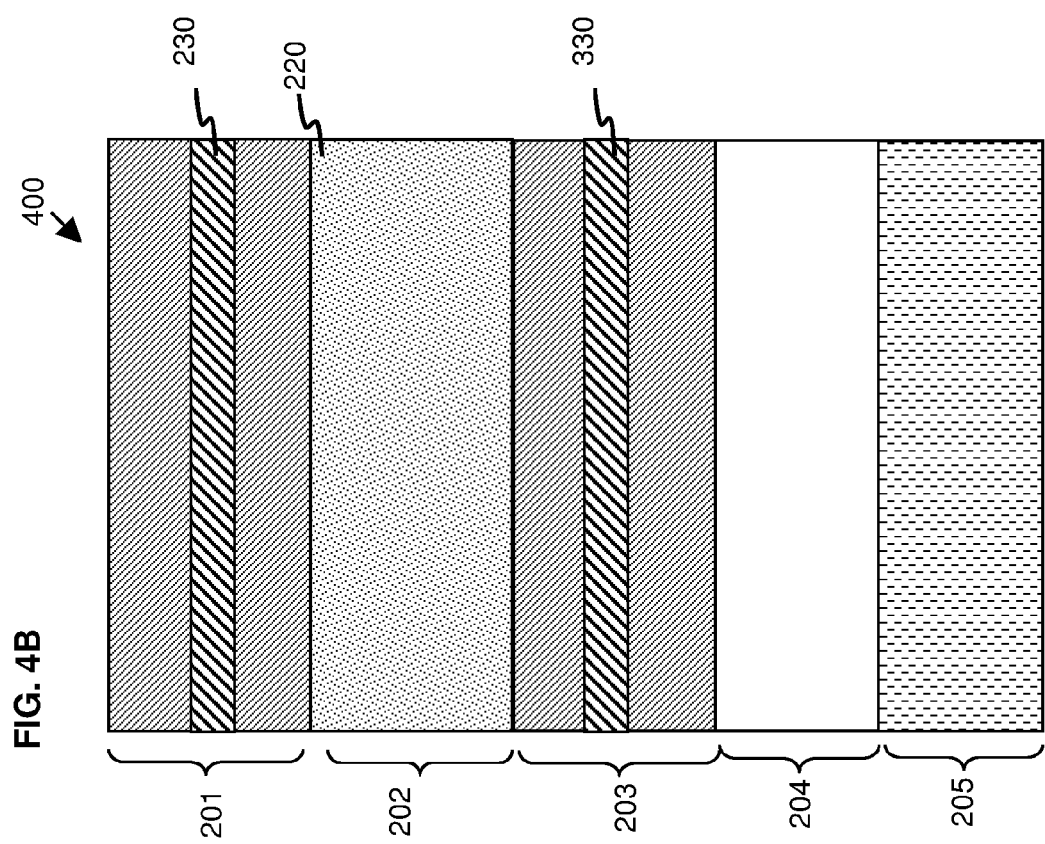
FIG. 4B is a cross-sectional view of the floating gate device with the oxygen scavenging element in both the floating gate and control gate once oxygen is removed according to an embodiment.

FIGS. 4A and 4B (generally referred to as FIG. 4) are a cross-sectional view a floating gate device 400 according to an embodiment. FIG. 4A shows the floating gate device 400 before the oxygen is removed, and FIG. 4B shows the floating gate device 300 after the oxygen is removed (and/or reduced). For simplicity, the floating gate device 400 represents a planar floating gate device (such as, e.g., the planar floating gate device 110) but the oxygen scavenging technique also applies to wrap-around devices (such as the wrap-around floating gate device 105) and other devices.

As depicted in the floating gate device 400, FIG. 4 is a combination of the floating gate devices 200 and 300 in both FIGS. 2 and 3. In FIG. 4, the oxygen scavenging element 230 is included in the control gate 201 while the oxygen scavenging element 330 is included in the floating gate 203. As such, both oxygen scavenging elements 230 and 330 remove oxygen from the floating gate device 400.

The description for FIGS. 2 and 3 applies to FIG. 4. Additionally, a native oxide layer 223 is grown at the interface between the channel 205 and the tunnel oxide 204. Accordingly, the native oxide layers 220, 221, 222, and 223 are shown in FIG. 4.

Annealing is applied to the floating gate device 400 as discussed above for floating gate devices 200 and 300. The floating gate device 400 is heated to elevate its temperature. By annealing the floating gate device 400, this initiates the oxygen scavenging process of both the oxygen scavenging elements 230 and 330 in which both scavenging elements 230 and 330 remove oxygen atoms from the native oxide layers 220, 221, 222, and 223.

The arrows 250, 350, and 351 illustrate oxygen being removed from the native oxide layers 220, 221, 222, and 223 and attracted to both the floating gate 203 and the control gate 201 (electrode). Although the arrows 250, 350, and 351 show the material of the scavenging elements 230 and 330 scavenging oxygen impurities from the native oxide layers 220, 221, 222, and 223, the scavenging elements 230 and 330 can remove oxygen impurities from other areas in the floating gate device 400. During the scavenging process, there is a net flow of oxygen to the scavenging elements 230 and 330 (formed within the control gate 201 and floating gate 203), and the oxygen from the native oxide layers 220, 221, 222, and 223 oxidizes the scavenging elements 230 and 330. Accordingly, the material of the scavenging elements 230 and 330 may change from Al to $Al_xO_y$ (i.e., aluminum oxide) after the oxygen scavenging process is completed. The scavenging elements 230 and 330 may each be multiple layers respectively formed within the control gate 201 and the floating gate 203.

FIG. 4B is the cross-sectional view of the floating gate device 400 after the anneal process according to an embodiment. In FIG. 4B, the native oxide layers 220, 221, 222, and 223 are completely and/or partially removed. Also, the scavenging elements 230 and 330 have now been oxidized by the oxygen respectively absorbed from the native oxide layers 220, 221, 222, and 223.

Some example materials for individually forming the control gate 201 and floating gate 203 are provided below, for illustration and not limitation. The electrodes, e.g., the control gate 201 and floating gate 203, with respective oxygen scavenging elements 230 and 330 may particularly comprise one or multiple layers of metal-nitride based conductive compounds (such as TiN-based conductive compounds and/or TaN-based conductive compounds), and/or the control gate 201 and floating gate 203 may particularly comprise one or multiple layers of multiple metal-carbide-based conductive compounds (such as TiC-based compounds and/or TaC-based compounds).

For example, the control gate 201 and floating gate 203 may respectively comprise a single layer of its respective oxygen scavenging element 230, 330 that is substantially in its elemental state, e.g., Al, Be, Mg, Ca, Sr, Ba, Sc, Y, La, Zr, Hf, Dy, Lu, Er, Pr, and/or Ce, and is sandwiched between two metal nitride compounds and/or sandwiched between two metal carbide compounds and/or sandwiched between a metal nitride compound and a metal carbide compound. Particularly, the respective oxygen scavenging elements 230, 330 sandwiched between the metal nitride conductive compounds may include a sandwich of TiN/Al/TiN and/or a sandwich of TaN/Al/TaN. Other sandwich stacks include but are not limited to TiC/Al/TiC, TaC/Al/TaC, TiN/Al/TiC, TiN/Al/TaC, and TiC/Al/TiN. Optionally, an additional doped Si layer may be included to have a sandwich of, e.g., TiN/Al/TiN/Si and TiN/Al/TiN/Si for the respective control and floating gates 201 and 203.

Additionally, throughout its entire thickness, the respective thickness of the control gate 201 and/or the thickness of the floating gate 203 are alloyed with its respective oxygen scavenging element 230 and 330. In other words, the respective composition (of the control gate 201 and/or the floating gate 203) is $M_xS_yN_z$ (also referred to as MSN) or $M_xS_yC_z$ (also referred to as MSC), where M denotes a metal, S denotes the oxygen scavenging element, N denotes nitrogen (nitride), and C denotes carbon (carbide). Particularly, to form the thickness of the control gate 201 and/or the thickness of the floating gate 203 as alloys, the respective oxygen scavenging elements 230, 330 mixed with the metal nitride conductive compound may form the alloy TaAlN and/or TiAlN, optionally with an additional doped Si layer.

Further, throughout part of its respective thickness, the control gate 201 and/or the floating gate 203 is alloyed with its respective oxygen scavenging element 230, 330, and the control gate 201 and/or the floating gate 203 is still formed into a sandwich. For example, the control gate 201 and/or the floating gate 203 may include an alloyed sandwich of TiN/TiAlN, TiN/TiAlN/TiN, TiN/TaAlN, and TiN/TaAlN/TiN, optionally with an additional doped Si layer.

The material of the scavenging elements 230 and 230 may be, e.g., aluminum (Al). One exemplary technique for forming control gate 201 and/or the floating gate 203 that respectively includes the scavenging element 230 and 330 is by implanting aluminum ions into the control gate 201 and floating gate 203. Another exemplary technique for forming the control gate 201 and floating gate 203 infused with the respective oxygen scavenging elements 230 and 330 is to (alternately) switch between disposing, e.g., a titanium nitride layer and disposing an aluminum layer until the control gate 201 and floating gate 203 are complete. Another exemplary technique for forming the control gate 201 and floating gate 203 infused with the respective scavenging element 230 and 330 is to dispose, e.g., titanium nitride, followed by simultaneously disposing, e.g., titanium nitride and aluminum and thus forming titanium aluminum nitride, until the control gate 201 and floating gate 203 are complete.

The material for the control gate 201 and floating gate 203 may be selected from, but is not limited to, Pt, TiN, TiC, TaN, TaC, as well as combinations thereof. The material for scavenging elements 230 and 330 may be selected from, but is not limited to, Al, Be, Mg, Ca, Sr, Ba, Sc, Y, La, Ti, Zr, Hf, Dy, Lu, Er, Pr, and Ce, as well as combinations thereof.

FIG. 5 illustrates an example of the floating gate 203 with embedded particles ('nanocrystals') 505 that can hold a charge according to an embodiment. The nanocrystals may include, but are not limited to, silicon nanocrystals. Although shown for illustration purposes, the nanocrystals 505 are not limited to a star shape and the nanocrystals 505 may be other shapes. In view 500, the oxygen scavenging elements 330 are dispersed throughout the floating gate 203. The material 510 of the floating gate 203 may be $SiO_2$ or any other insulator, and the oxygen scavenging elements 330 are dispersed in the material 510 of the floating gate 203. The nanocrystals 505 may be embedded (nano-chunks) within the material of the floating gate 203.

Shells (i.e., native oxide shells) 224 of oxide may be formed near and/or around the nanocrystals 505. The dispersed oxygen scavenging elements 330 attract and remove the shells 224 of native oxide from around nanocrystals 505 when annealing (heating) occurs. View 550 shows the floating gate 203 with the shells 224 of native oxide removed from around and/or near the nanocrystals 505. In view 550, the dispersed oxygen scavenging elements 330 have been oxidized by the oxygen removed from the native oxide shells 224. Further, by having the floating gate 203 with the dispersed oxygen scavenging elements (chunks) 330 (as shown in FIG. 5), the dispersed oxygen scavenging elements 330 do not interfere with the function of the floating gate 203 to hold (and/or discharge when desired) a charge when operating as a memory floating gate device (such as, e.g., flash memory).

The floating gate 203 in FIG. 5 may replace/implement the floating gate 203 in the floating gate device 200, 300, and 400 as described in FIGS. 1-4 and 6-8. Also, with the exception of the nanocrystals 505, the floating gate 203 as shown in FIG. 5 can replace/implement the control gate 201 described in the floating gate device 200, 300, and 400.

Also, note that as shown in FIG. 5, dispersed oxygen scavenging elements 230, 330 (e.g., aluminum elements) may diffuse into the high-k interpoly dielectric 202 as desired. As such, the oxygen scavenging elements 230, 330 (of aluminum) can trap oxygen from native oxide layers 220, 221, 222 as discussed herein. Accordingly, the high-k interpoly dielectric 202 in the floating gate device 200, 300, and 400 can have the high-k interpoly dielectric 202 with embedded oxygen scavenging elements 230, 330, so that the high-k interpoly dielectric 202 traps oxygen.

FIG. 6 illustrates a flow chart 600 of a method for forming a floating gate device according to an embodiment. Reference can be made to FIGS. 1, 2, and 5.

The tunnel oxide layer 204 is formed over the channel 205 at block 605. The floating gate 203 is formed over the tunnel oxide layer 204 at block 610. The high-k interpoly dielectric layer 202 is formed over the floating gate 203 at block 615. The control gate 201 is formed over the high-k dielectric layer 202, and the control gate 201 includes the oxygen scavenging element 230 at block 620. At block 625, the oxygen scavenging element 230 decreases an oxygen density at a first interface (e.g., native oxide layer 220) between the control gate 201 and the high-k dielectric layer 202 and at a second interface (e.g., native oxide layer 221) between the high-k dielectric layer 202 and the floating gate 203 responsive to annealing.

The control gate 201 having the oxygen scavenging element 230 comprises at least one layer of a metal-nitride based conductive compound, where at least one of the following conditions applies:

(a) a single layer of the oxygen scavenging element 230 is substantially in an elemental state and is sandwiched between two layers of the metal-nitride based conductive compound (as shown in FIG. 2).

(b) throughout an entire thickness of the metal-nitride based conductive compound of the control gate 201, the control gate 201 is alloyed with the oxygen scavenging element 230 (i.e., the oxygen scavenging element 230 is mixed throughout (the metal-nitride based conductive compound of) the control gate 201 and not just in a single layer).

(c) throughout part of the thickness of the metal-nitride based conductive compound of the control gate 201, the control gate 201 is alloyed with the oxygen scavenging element (i.e., the oxygen scavenging element 230 is mixed/alloyed throughout only part of (the metal-nitride based conductive compound of) the control gate 201 while the other part is metal-nitride based conductive compound).

The control gate 201 having the oxygen scavenging element 230 includes at least one layer of metal-carbide based conductive compound, where at least one of the following conditions applies:

(a) a single layer of the oxygen scavenging element 230 is substantially in an elemental state and is sandwiched between two layers of the metal-carbide based conductive compound (as shown in FIG. 2).

(b) throughout an entire thickness of the metal-carbide based conductive compound of the control gate 201, the control gate 201 is alloyed with the oxygen scavenging element 230 (i.e., the oxygen scavenging element 230 is mixed throughout (the metal-carbide based conductive compound of) the control gate 201 and not just in a single layer).

(c) throughout part of the thickness of the metal-carbide based conductive compound of the control gate 201, the control gate 201 is alloyed with the oxygen scavenging element 230 (i.e., the oxygen scavenging element 230 is mixed/alloyed throughout only part of (the metal-carbide based conductive compound of) the control gate 201 while the other part is metal-nitride based conductive compound).

The high-k dielectric layer 202 is a dielectric material with a dielectric constant greater than a dielectric constant for silicon, and the dielectric material of the high-k dielectric layer 202 excludes rare earth high-k dielectric materials.

FIG. 7 illustrates a flow chart 700 of a method for forming a floating gate device according to an embodiment. Reference can be made to FIGS. 1, 3, and 5.

A tunnel oxide layer 204 is formed over the channel 205 at block 705. The floating gate 203 is formed over the tunnel oxide layer 204, and the floating gate 203 includes the oxygen scavenging element 330 at block 710. The high-k interpoly dielectric layer 202 is formed over the floating gate 203 at block 715. The control gate 201 is formed over the high-k dielectric layer 202 at block 720. The oxygen scavenging element 330 decreases an oxygen density at a first interface (e.g., native oxide layer 220) between the control gate 201 and the high-k dielectric layer 202 responsive to annealing at block 725, decreases the oxygen density at a second interface (e.g., native oxide layer 221) between the high-k dielectric layer 202 and the floating gate 203 responsive to the annealing at block 730, and decreases the oxygen density at a third interface (e.g., native oxide layer 222) between the floating gate 203 and the tunnel oxide layer 204 responsive to the annealing 735.

The floating gate 203 having the oxygen scavenging element includes at least one layer of a metal-nitride based conductive compound, where at least one of the following conditions applies (the above discussions for the control gate 201 in FIG. 6 apply by analogy to the floating gate 203):

(a) a single layer of the oxygen scavenging element is substantially in an elemental state and is sandwiched between two layers of the metal-nitride based conductive compound.

(b) throughout an entire thickness of the metal-nitride based conductive compound of the floating gate 203, the floating gate 203 is alloyed with the oxygen scavenging element 330.

(c) throughout part of the thickness of the metal-nitride based conductive compound of the floating gate 203, the floating gate 203 is alloyed with the oxygen scavenging element 330.

The floating gate 203 having the oxygen scavenging element 330 includes at least one layer of metal-carbide based conductive compound, where at least one of the following conditions applies (the above discussions for the control gate 201 in FIG. 6 apply by analogy to the floating gate 203):

(a) a single layer of the oxygen scavenging element 330 is substantially in an elemental state and is sandwiched between two layers of the metal-carbide based conductive compound;

(b) throughout an entire thickness of the metal-carbide based conductive compound of the floating gate 203, the floating gate 203 is alloyed with the oxygen scavenging element 330.

(c) throughout part of the thickness of the metal-carbide based conductive compound of the floating gate 203, the floating gate 203 is alloyed with the oxygen scavenging element 330.

The high-k dielectric layer 202 is a dielectric material with a dielectric constant greater than a dielectric constant for silicon, and the dielectric material of the high-k dielectric layer excludes rare earth high-k dielectric materials.

FIG. 8 illustrates a flow chart 800 of a method for forming a floating gate device according to an embodiment. Reference can be made to FIGS. 1-7.

The tunnel oxide layer 204 is formed over the channel 205 at block 805. The floating gate 203 is formed over the tunnel oxide layer 204, and the floating gate 203 includes a first oxygen scavenging element 330 at block 810. The high-k dielectric layer 202 is formed over the floating gate 203 at block 815. The control gate 201 is formed over the high-k dielectric layer 202, and the control gate 201 includes a second oxygen scavenging element 230 at block 820.

The first and second oxygen scavenging elements 330 and 230 decrease an oxygen density at a first interface (e.g., native oxide layer 220) between the control gate 201 and the high-k dielectric layer 202 responsive to annealing at block 825.

The first and second oxygen scavenging elements 330 and 230 decrease the oxygen density at a second interface (e.g., native oxide layer 221) between the high-k dielectric layer 202 and the floating gate 203 responsive to the annealing at block 830.

The first oxygen scavenging element 330 decreases the oxygen density at a third interface (e.g., native oxide layer 222) between the floating gate 203 and the tunnel oxide layer 204 responsive to the annealing at block 835.

The first oxygen scavenging element decreases the oxygen density at a fourth interface (e.g., native oxide layer 223) between the tunnel oxide layer 204 and the channel 205 responsive to the annealing at block 840.

Additionally, the high-k dielectric layer is a dielectric material of at least one of $HfO_2$, HfSiO, HfSiON, and $Al_2O_3$ FIG. 8 corresponds to both the control gate 201 and floating gate 203 having their respective oxygen scavenging elements 230 and 330, and FIG. 8 is the combination of the discussions for FIGS. 6 and 7. Although all details of FIGS. 6 and 7 are not repeated again in FIG. 8 for the sake of brevity, FIG. 8 is meant to include the discussions of FIGS. 6 and 7.

The floating gate devices 200, 300, and 400 discussed herein may be utilized in a circuit (or electronic device) as understood by one skilled in the art. For example, floating gate devices 200, 300, and 400 may be utilized in circuits for memory devices as understood by one skilled in the art.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the exemplary embodiments of the invention have been described, it will be understood that those skilled in the art, both now and in the future, may make various improvements and enhancements which fall within the scope of the claims which follow. These claims should be construed to maintain the proper protection for the invention first described.

What is claimed is:

1. A method for forming a floating gate device, comprising:
   forming a tunnel oxide layer over a channel;
   forming a floating gate over the tunnel oxide layer;
   forming a high-k dielectric layer over the floating gate;
   forming a control gate over the high-k dielectric layer, the control gate comprising an oxygen scavenging element;
   wherein the floating gate device is formed of the tunnel oxide layer, the floating gate, the high-k dielectric layer, and the control gate;
   wherein forming the floating gate device causes a first native oxide layer at a first interface between the control gate and the high-k dielectric layer and causes a second native oxide layer at a second interface between the high-k dielectric layer and the floating gate;
   after the floating gate device has been formed by the tunnel oxide layer, the floating gate, the high-k dielectric layer, and the control gate, annealing the floating gate device in order to decrease by the oxygen scavenging element an oxygen density at, at least one of, the first native oxide layer at the first interface between the control gate and the high-k dielectric layer and the second native oxide layer at the second interface between the high-k dielectric layer and the floating gate.

2. The method of claim 1, wherein the control gate having the oxygen scavenging element, comprises at least one layer of a conductive compound;
   wherein at least one of:
      a single layer of the oxygen scavenging element is sandwiched between two layers of the conductive compound;
      throughout an entire thickness of the conductive compound of the control gate, the control gate is alloyed with the oxygen scavenging element; and
      throughout part of the thickness of the conductive compound of the control gate, the control gate is alloyed with the oxygen scavenging element.

3. The method of claim 1, wherein the conductive compound of the control gate comprises at least one of a metal nitride and a metal carbide.

4. The method of claim 1, wherein the high-k dielectric layer is a dielectric material with a dielectric constant greater than a dielectric constant of silicon oxide.

5. The floating gate device of claim 4, wherein the dielectric material of the high-k dielectric layer excludes rare earth high-k dielectric materials.

6. The floating gate device of claim 1, wherein the high-k dielectric layer comprises a dielectric material of at least one of $HfO_2$, HfSiO, HfAlO, HfSiON, and $Al_2O_3$.

7. A method for forming a floating gate device, comprising:
   forming a tunnel oxide layer over a channel;
   forming a floating gate over the tunnel oxide layer, the floating gate comprising an oxygen scavenging element;
   forming a high-k dielectric layer over the floating gate;
   forming a control gate over the high-k dielectric layer;
   wherein the floating gate device is formed of the tunnel oxide layer, the floating gate, the high-k dielectric layer, and the control gate;
   wherein forming the floating gate device causes a first native oxide layer at a first interface between the control gate and the high-k dielectric layer and causes a second native oxide layer at a second interface between the high-k dielectric layer and the floating gate;
   after the floating gate device has been formed by the tunnel oxide layer, the floating gate, the high-k dielectric layer, and the control gate, annealing the floating gate device in order to at least one of:
      decrease by the oxygen scavenging element an oxygen density at the first native oxide layer at the first interface between the control gate and the high-k dielectric layer;
      decrease by the oxygen scavenging element the oxygen density at the second native oxide layer at the second interface between the high-k dielectric layer and the floating gate;
      decrease by the oxygen scavenging element the oxygen density at a third interface between the floating gate and the tunnel oxide layer; and
      decrease by the oxygen scavenging element the oxygen density at a fourth interface between the tunnel oxide layer and the channel.

8. The method of claim 7, wherein the floating gate having the oxygen scavenging element, comprises at least one layer of a conductive compound;
   wherein at least one of:
      a single layer of the oxygen scavenging element is sandwiched between two layers of the conductive compound;
      throughout an entire thickness of the conductive compound of the floating gate, the floating gate is alloyed with the oxygen scavenging element; and
      throughout part of the thickness of the conductive compound of the floating gate, the floating gate is alloyed with the oxygen scavenging element.

9. The method of claim 7, wherein the conductive compound of the floating gate comprises at least one of a metal nitride and a metal carbide.

10. The method of claim 7, wherein the high-k dielectric layer is a dielectric material with a dielectric constant greater than a dielectric constant of silicon oxide.

11. The method of claim 10, wherein the dielectric material of the high-k dielectric layer excludes rare earth high-k dielectric materials.

12. The method of claim 7, wherein the high-k dielectric layer comprises a dielectric material of at least one of $HfO_2$, HfSiO, HfAlO, HfSiON, and $Al_2O_3$.

13. A method for forming a floating gate device, comprising:
   forming a tunnel oxide layer over a channel;
   forming a floating gate over the tunnel oxide layer, the floating gate comprising a first oxygen scavenging element;
   forming a high-k dielectric layer over the floating gate;
   forming a control gate over the high-k dielectric layer, the control gate comprising a second oxygen scavenging element;
   wherein the floating gate device is formed of the tunnel oxide layer, the floating gate, the high-k dielectric layer, and the control gate;
   wherein forming the floating gate device causes a first native oxide layer at a first interface between the control gate and the high-k dielectric layer and causes a second native oxide layer at a second interface between the high-k dielectric layer and the floating gate;

after the floating gate device has been formed by the tunnel oxide layer, the floating gate, the high-k dielectric layer, and the control gate, annealing the floating gate device in order to at least one of:

decrease by the first and second oxygen scavenging elements an oxygen density at the first native oxide layer at a-the first interface between the control gate and the high-k dielectric layer;

decrease by the first and second oxygen scavenging elements the oxygen density at the second native oxide layer at the second interface between the high-k dielectric layer and the floating gate;

decrease by the first oxygen scavenging element the oxygen density at a third interface between the floating gate and the tunnel oxide layer; and decrease by the first oxygen scavenging element the oxygen density at a fourth interface between the tunnel oxide layer and the channel.

14. The method of claim 13, wherein the floating gate having the first oxygen scavenging element comprises at least one layer of a conductive compound;

wherein the control gate having the second oxygen scavenging element, comprises at least one layer of the conductive compound; and wherein at least one of the following conditions applies to the floating gate:

a single layer of the first oxygen scavenging element is sandwiched between two layers of the conductive compound in the floating gate;

throughout an entire thickness of the conductive compound of the floating gate, the floating gate is alloyed with the first oxygen scavenging element; and throughout part of the thickness of the conductive compound of the control gate, the control gate is alloyed with the second oxygen scavenging element; and wherein at least one of the following conditions applies to the control gate:

a single layer of the second oxygen scavenging element is sandwiched between two layers of the conductive compound in the control gate;

throughout an entire thickness of the conductive compound of the control gate, the control gate is alloyed with the second oxygen scavenging element; and through part of the thickness of the conductive compound of the control gate, the control gate is alloyed with the second oxygen scavenging element.

15. The method of claim 13, wherein the conductive compound of the control gate and the floating gate comprises at least one of a metal nitride and a metal carbide.

16. The method of claim 13, wherein the high-k dielectric layer is a dielectric material with a dielectric constant greater than a dielectric constant of silicon oxide.

17. The method of claim 16, wherein the dielectric material of the high-k dielectric layer excludes rare earth high-k dielectric materials.

18. The method of claim 13, wherein the high-k dielectric layer comprises a dielectric material of at least one of $HfO_2$, $HfSiO$, $HfAlO$, $HfSiON$, and $Al_2O_3$.

* * * * *